United States Patent [19]

Roth

[11] Patent Number: 5,289,567
[45] Date of Patent: Feb. 22, 1994

[54] COMPUTER APPARATUS AND METHOD FOR FINITE ELEMENT IDENTIFICATION IN INTERACTIVE MODELING

[75] Inventor: James W. Roth, Maynard, Mass.

[73] Assignee: Digital Equipment Corporation, Maynard, Mass.

[21] Appl. No.: 678,691

[22] Filed: Apr. 1, 1991

[51] Int. Cl.$^5$ .............................................. G06F 15/62
[52] U.S. Cl. ..................................... 395/133; 395/155
[58] Field of Search ............... 395/119, 120, 133, 155, 395/161

[56] References Cited

U.S. PATENT DOCUMENTS 5,159,664  10/1992  Yamamoto et al. ................ 395/133

OTHER PUBLICATIONS

Bentley, "Multidimensional Binary Search Trees Used for Associative Searching", Communications of the ACM, Sep. 1975, vol. 18, No. 9, pp. 509–517.
Marketing Brochure, Digital Equipment Corp. 1988.
Mills, R., "Engineering Visualization", *Computer-Aided Engineering*, pp. 36–50 Mar. 1990.
Marketing Brochure, Wavefront Technologies "The Data Visualizer" Jan. 1991.
Carrabine, L., "Powerful Pictures Enlighten Engineers", *Computer-Aided Engineering*, pp. 48–55 Apr. 1991.
Proceedings Fifth International Conference on Data Engineering Feb. 8–10, 1989 Los Angeles, Calif., U.S. pp. 606–615; Greene: "An Implementation and Performance Analysis of Spatial Data Access Methods".
Machine Design, vol. 62, No. 4, Feb. 22, 1990, Cleveland, U.S. pp. 74–80; Dvorak: "Filling Out the FEA Family".

*Primary Examiner*—Mark K. Zimmerman
*Attorney, Agent, or Firm*—Albert P. Cefalo; Ronald C. Hudgens

[57] ABSTRACT

Computer apparatus for querying elements of a finite element model. The apparatus includes a tree data structure having leaf nodes corresponding to elements of the model and intermediate nodes corresponding to subsets of elements of the model. The tree data structure is recursively constructed in a working memory in response to initial user command to query a desired model. The tree data structure is traversed in response to user interaction with a desired element of the model displayed in a screen view on a display unit. Within an intermediate level of the tree, nodes in the level are arranged according to spatial relationship of corresponding subsets of elements of the model with respect to at least one axis of a geometric area covered by the elements in a screen view of the model. The tree is traversed according to geometric area in which the desired element is positioned in the screen view of the model. The traversal results in location of a leaf node which corresponds to the desired element and which provides an indication of memory location of data of the desired element for access thereof. Such memory location and access of data of an element is on the order of the log of the number of model elements, which is faster than a linear search for element data in the memory.

15 Claims, 9 Drawing Sheets

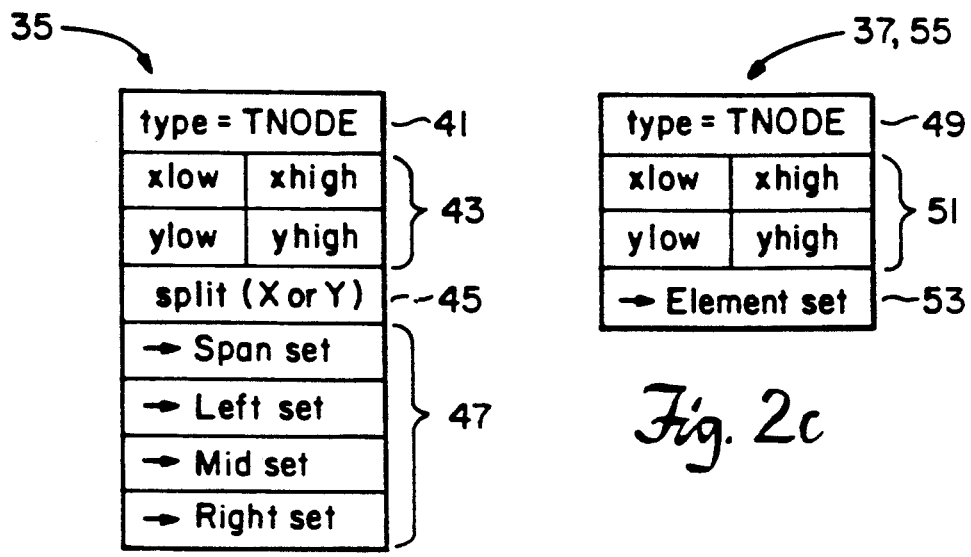
Fig. 2b
Fig. 2c
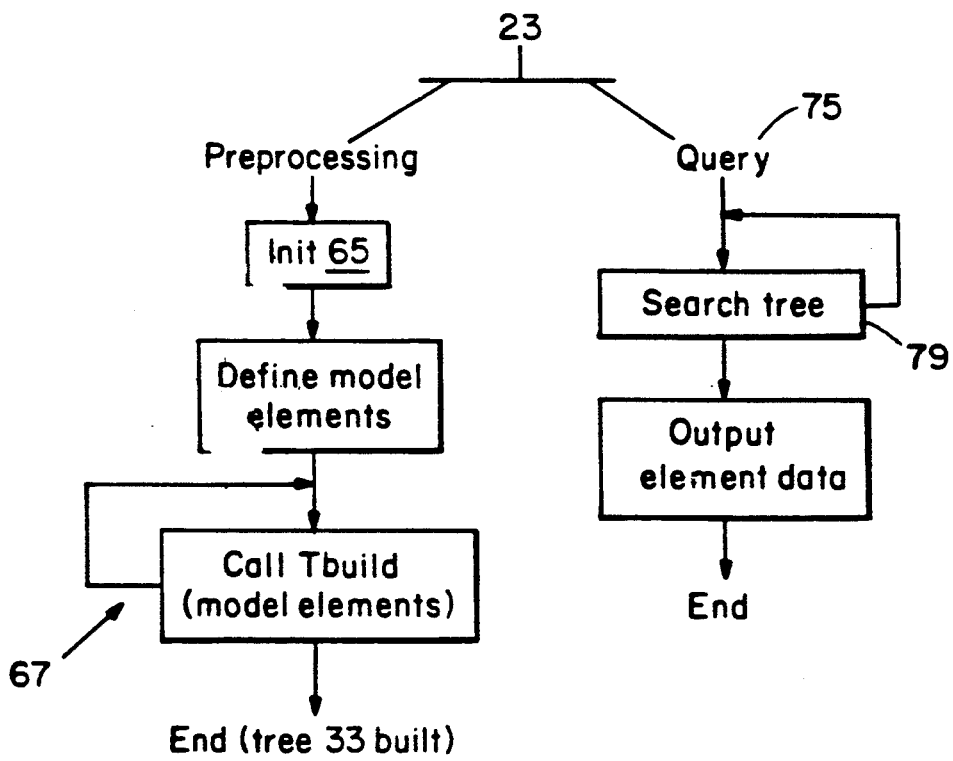
Fig. 3a

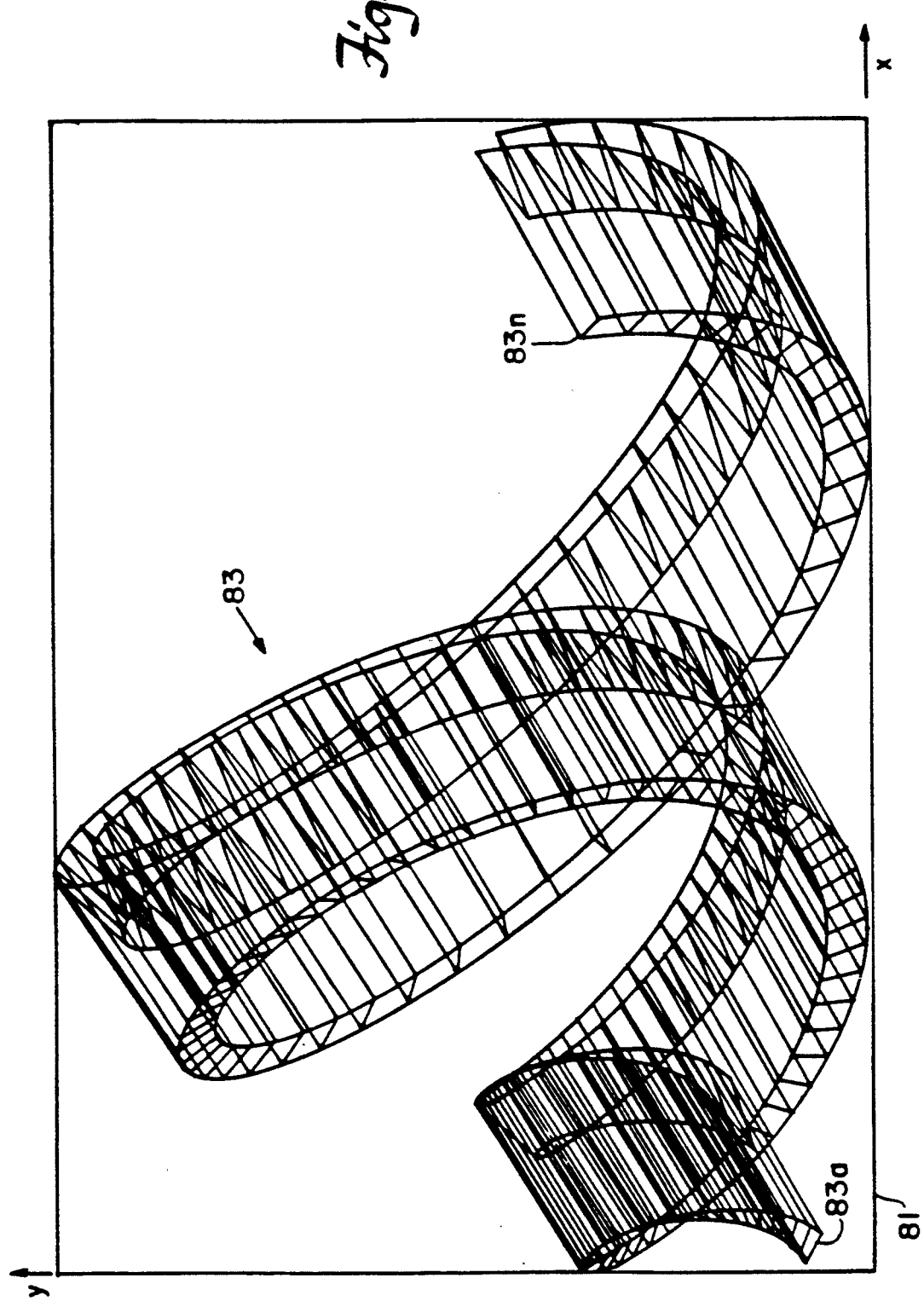

COMPUTER APPARATUS AND METHOD FOR FINITE ELEMENT IDENTIFICATION IN INTERACTIVE MODELING

BACKGROUND OF THE INVENTION

"Finite element analysis" is a mathematical approach to solving large (complex) problems. Generally the subject is segmented or discretized into many pieces that have closed form solutions. That is, each piece is definable by a linear equation, and hence is a "finite element." Collectively, the linear equations of the pieces form a system of equations that are simultaneously solvable.

Computer programs for simulating finite element analysis in various applications exit. For example, finite modeling programs are used by design engineers. Typically many thousands of elements are created to model a subject object and in particular three dimensional objects. For each element, there is geometric information such as an (x, y, z) coordinate at a point in the element, an element type, material property, stress value, displacement, thermal value, etc. Such information is definable by linear equations for the elements. To that end, finite analysis is employed to model the subject object.

Example finite modeling programs include: ANSYS by Swanson Analysis Systems Inc. of Houston, Pa; SUPERTAB by Structural Dynamics Research Corp. of Ohio; and PATRAN by PDA Engineering of Costa Mesa, Calif.

One disadvantage of such finite element modeling is that the large number of elements presents a problem in verifying geometric correctness of the model and resulting element information in the model. That is, one need in finite modeling computer programs is a very fast interactive way for an engineer to view a model and make queries, preferably by directly pointing with the screen cursor through mouse operations. Typical information to be returned by query functions include the geometric information and physical/material property information. Ideally a "direct manipulation" interface is desired, so that the engineer can feel as if he is pointing to locations on an object in his hand.

Some existing finite element modeling computer programs, such as PATRAN by PDA Engineering of Costa Mesa, Calif., allow data queries. In particular, these programs use simple linear searches through a geometry database. Typically, an engineer using such computer programs type a command declaring that some number of elements are to be "picked" and that designated information regarding the elements is to be returned. Using the mouse, he then moves the screen cursor to a point on the displayed model and operates a mouse button; after a few seconds the computer program finds the elements nearest the cursor and outputs the requested information. Often due to the clutter of a complex, 3-dimensional model on a two dimensional screen view, an incorrect element is picked, requiring another try and another several seconds wait. This is most serious on very large models where on the order of tens of thousands of queries need to be done, since these models are the slowest to process.

Thus, the existing query techniques can be very slow since thousands of elements may need to be checked for a "hit." Because of this bottleneck, finite element modeling computer programs do not provide a lively human interface for query functions. Accordingly, there is a need for a better interactive way for an engineer to view a model and make queries regarding the elements of the model.

SUMMARY OF THE INVENTION

The present invention provides a computer apparatus and method which solves the problems of the prior art. In particular, the present invention provides computer apparatus and method for interactively querying a model in a manner which is time efficient and element precise.

In a preferred embodiment, computer apparatus of the present invention is employed in a computer system having (i) a source of models of objects, each model formed of a plurality of elements, (ii) a first memory area holding data defining each element, (iii) a display unit for displaying screen views of a model, and (iv) a digital processor coupled to the source of models, first memory area and display unit. The digital processor enables user interaction with the screen view of a desired model. Upon user interaction with a desired element of a model displayed on the display unit, the present invention computer apparatus accesses from the first memory area data defining the desired element and enables display of the same through the display unit. To accomplish this, the present invention computer apparatus employs a data tree and processor means.

The data tree includes a root node and a plurality of tree nodes and leaf nodes corresponding to subsets of elements of a desired model. The root node and plurality of tree nodes and leaf nodes are arranged in a hierarchy such that the root node is at a highest level, the tree nodes are at intermediate levels and leaf nodes are at a lowest level. Each leaf node provides an indication of location in the first memory area of data of corresponding elements. Further, within each of the intermediate levels, nodes in the level are arranged according to spatial relationship of corresponding subsets of elements of the model with respect to at least one axis of a geometric area covered by the elements in a screen view of the model.

The processor means employed by the present invention are executable by the digital processor and traverse the data tree in response to user interaction with the desired element of a model displayed on the display unit. The processor means traverses the tree according to geometric area in which the desired element is positioned in a screen view of the model. Further the processor means locates a leaf node in the tree corresponding to the desired element, and from the leaf node the processor means obtains indication of location in the first memory area of data of the desired element. To that end, the processor means accesses the element data from the first memory area and enables display of the data through the display unit.

In accordance with one aspect of the present invention the processor means traverses the data tree and locates the leaf node that corresponds to the desired element in a manner that is faster than a linear search for the element data in the first memory area. In particular, the processor means accesses the element data from the first memory area in an amount of time that is proportional to log n where n is the number of elements in the model.

In accordance with another aspect of the present invention the processor means includes a recursive routine for traversing the tree in search of the leaf node corresponding to the desired element.

In accordance with another aspect of the present invention the data tree is recursively constructed in a working memory, in response to initial user command to query the desired model.

In other embodiments of the present invention, the source of models may be a second memory holding a plurality of models of objects. Alternatively, the first memory area may hold both data defining each element and the plurality of models.

In accordance with another aspect of the present invention the geometric area covered by the elements is generally rectangular in shape and has a longitudinal (major) axis and traverse (minor) axis. To that end, the nodes in a common level of the data tree are arranged with a first node positioned at one end of the common level and corresponding to a subset of elements lying on one side of the longitudinal axis. A second node is positioned at an opposite end of the common level and corresponds to a subset of elements lying on an opposite side of the longitudinal axis. A third node is positioned between the first and second nodes in the common level and corresponds to a subset of elements that straddle or bridge the longitudinal axis. Further there are leaf nodes defined in the data tree for subsets of elements that straddle both the longitudinal and traverse axes.

BRIEF DESCRIPTION OF THE DRAWINGS

The foregoing and other object, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

FIGS. 2b and 2c are block diagrams of data structures employed by the present invention.

FIGS. 3a-3c are flow charts of the present invention.

FIGS. 4a-4g are illustrations of steps performed in the flow chart of FIGS. 3a-3c.

DETAILED DESCRIPTION OF THE PREFERRED EMBODIMENTS

Figure 1:
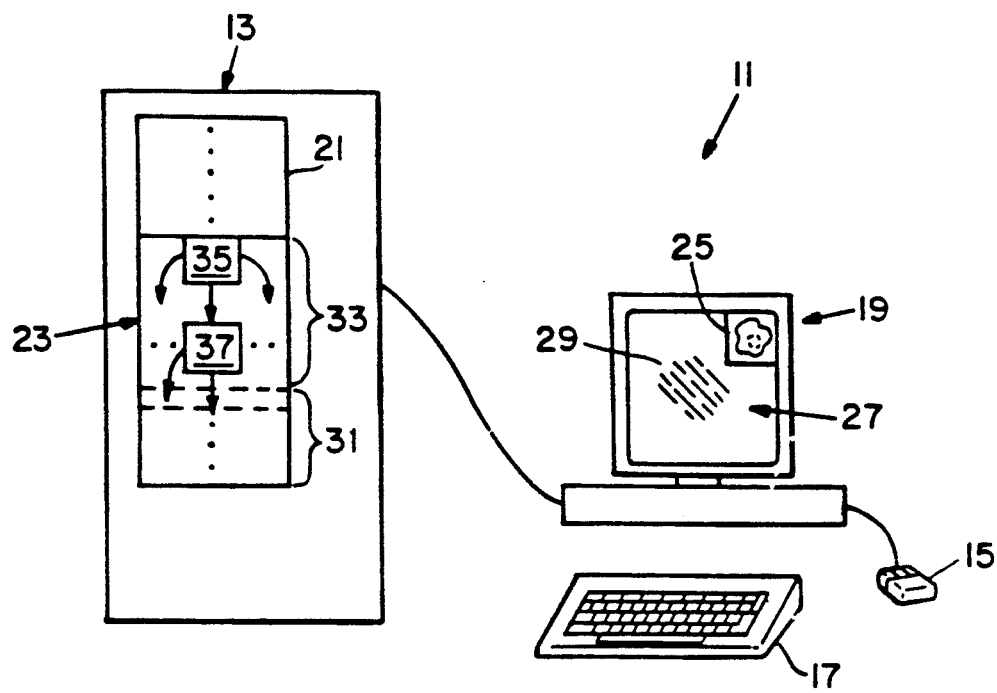
FIG. 1 is a schematic illustration of a computer system employing an embodiment of the present invention.

FIG. 1 illustrates a computer system 11 employing an embodiment of the present invention. Generally shown is a digital processor 13 coupled to a keyboard 17 and mouse 15 to receive user input therefrom, and coupled to a display unit 19 to display output thereon. Within the digital processor 13 is a finite element modeling computer program 21 employing the present invention computer apparatus 23. The computer program 21 enables a user to model a desired object using finite element analysis. In particular, the computer program 21 generates a model of a subject object having a plurality of discrete elements defined in part by user input data and in part by processor calculations performed on the input data. The computer program 21 (through the digital processor 13) enables display of the generated model in a screen view on the display unit 19 and enables user interaction with the screen view of the model through keyboard 17 and/or mouse 15 operations. Methods and means for accomplishing the foregoing are known in the art and include computer programs such as "ANSYS" by Swanson Analysis Systems, Inc., "PATRAN" by PDA Engineering of Costa Mesa, Calif., and graphics standard "PHIGS" (Programmers Hierarchical Interactive Graphics System) software systems available from Digital Equipment Corporation, Hewlett-Packard Company and the like for respective workstations.

Specific to the present invention computer apparatus 23, subsequent to the generation of the model there are times when a user desires to know the data input (raw data used in calculations) or output (results of calculations) for each point in the model. To obtain such data, the user interacts with the screen view of the model preferably through the mouse 15 as follows. The user selects a "query" item from a menu, or the like, displayed in the screen view, by positioning the screen cursor 29 in the screen view position of the desired menu selection and operating (clicking) a mouse button. The user then operates the mouse to move the screen cursor 29 to various positions in the screen view of the model, to effectively point to (or pick) various elements in the model. In response, the present invention computer apparatus 23 performs the following actions. In real time, the present invention computer apparatus 23 causes the element to which the cursor 29 currently points to be displayed highlighted in the screen view. In addition the present invention computer apparatus 23 outputs (i.e., displays) in the screen view the user requested information, according to the selected menu query item, regardless of how complex the model is. Thus there is no need for the user to operate mouse buttons and wait; merely moving the cursor 29 elsewhere in the screen view of the model selects a new element to query which in turn generates display of the user requested information.

Further the present invention computer apparatus 23 provides a split screen of (or separate window in) the screen view of the model. Specifically, the present invention provides in one part 27 of the screen view a localized, detailed view of an element or neighboring elements to which the cursor 29 currently points. In a second part 25 of the screen view, the model is displayed in full with an indication, such as broken line rectangle, of the portion of the model shown in the first part 27.

As a result, the present invention provides immediate feedback to the user, is less error prone (i.e. provides more precise user selection of model elements to view), and encourages much more thorough verification and interpretation of a model. The limit is not processing time, but memory to hold the model.

Figure 2A:
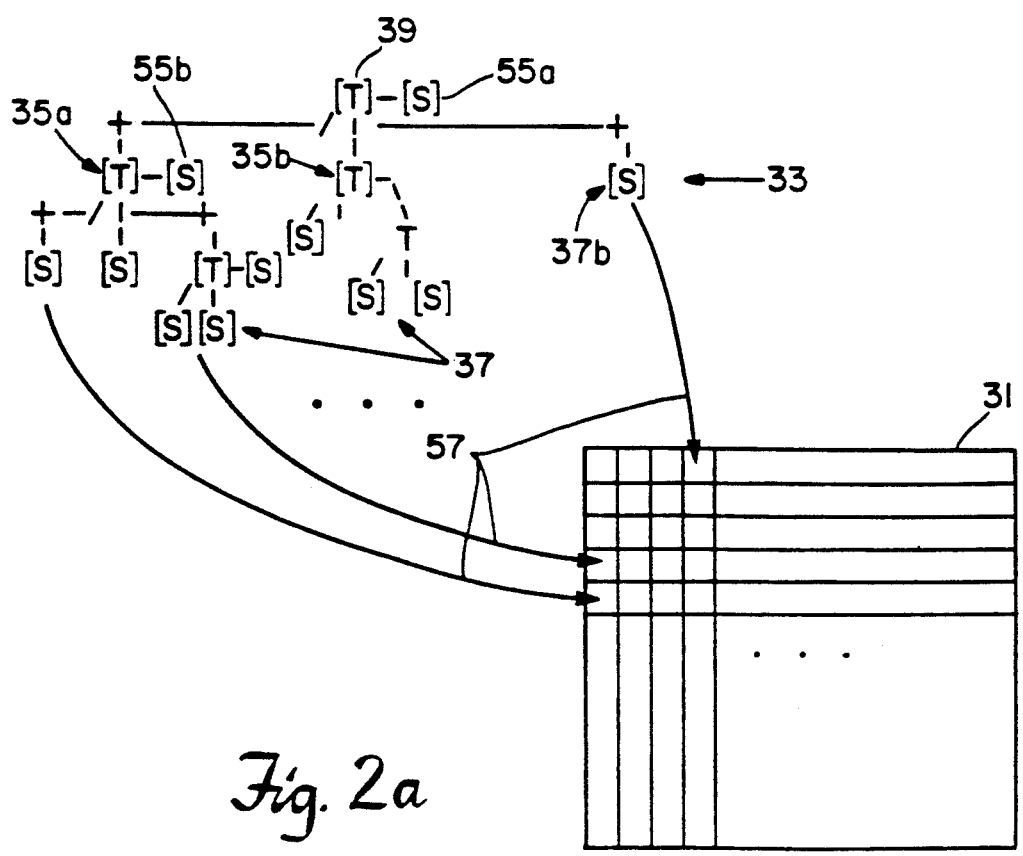
FIG. 2a is a schematic illustration of an embodiment of the present invention employed in the system of FIG. 1.

To accomplish the foregoing, the present invention computer apparatus 23 employs a memory block 31 for holding raw and calculated data of each element of the model, and a tree data structure 33 in working memory for searching and accessing the memory block 31 in shorter amounts of time than that possible in the prior art. As illustrated in FIG. 2a the tree data structure 33 is arranged with a root 39 at the tree entry level, various subsequent levels of subtrees formed of tree nodes 35 and inner leaf nodes 55, and a terminal level of leaf nodes 37. Each leaf node 37, 55 holds a pointer 57 to a respective location in the memory block 31 which holds the desired (raw and calculated) data of a respective element of the model. The pointers 57 are created as the tree 33 is built.

Figure 3B:
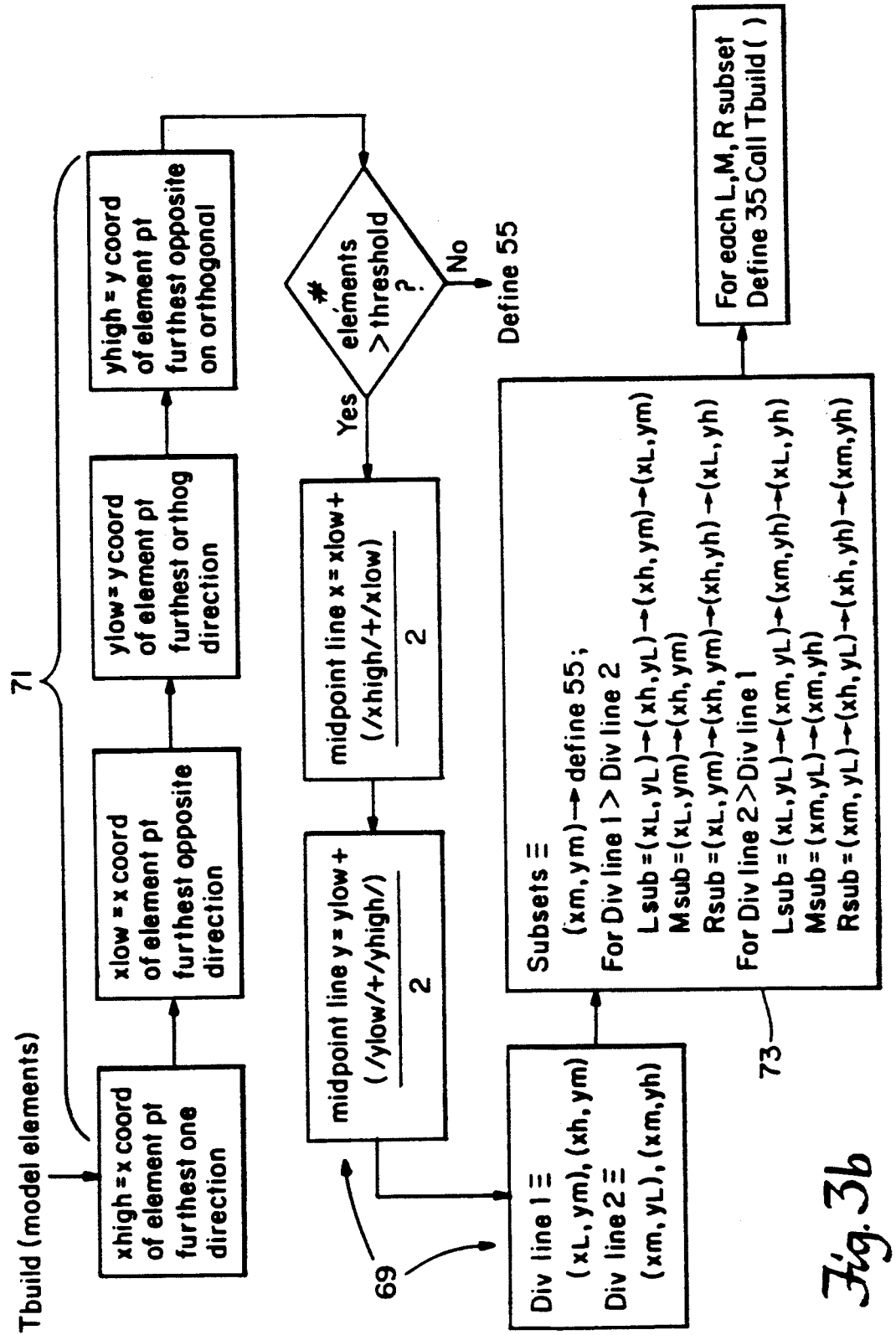

The tree 33 is built in a preprocessing phase and used in the interactive phase as illustrated in FIGS. 3a-3b. The idea is that the geometric data of the model is static at the time a query operation is initiated. Hence, the time spent preprocessing the geometric data will be amortized over a large number of interactive queries. Querying is handled so quickly that output data can be updated continuously in response to cursor motion, even on low cost desktop workstations.

Preprocessing Phase

Referring to FIG. 3a, the present invention computer apparatus 23 first performs an initialization 65 in the preprocessing phase. Initialization 65 includes establishing a pointer to the root 39 of the tree data structure 33, allocating memory for the tree 33 and memory block 31, and recording identification (or association) of the tree 33 and memory block 31 with the particular model. Further, during initialization 65, the invention computer apparatus 23 enables the geometric finite elements and pertinent menus to be projected in the screen view. This is typically performed in response to user selection of a view of the model. In effect this serves to define a current session and the working (subject) elements of the model for the session.

When a query operation is initiated by a menu pick, the invention computer apparatus 23 recursively constructs the tree 33, one tree node 35 and associated leaf nodes 37, 55 at a time, as indicated at 67 in FIG. 3a and described next with reference to the flow diagram of FIG. 3b and illustration of FIGS. 4a-4g. In the example illustrated in FIGS. 4a-4g a desired model is shown formed of generally prism shaped elements 83 connected in series.

The present invention computer apparatus 23 calculates a two dimensional bounding box 81 (e.g., a rectangle as shown in FIG. 4a) about the current set of elements 83 displayed in the model. The present invention computer apparatus 23 accomplishes this by linearly scanning the set of elements 83 and determining the greatest distance along two orthogonal axes (for example x and y axes in the first four steps 71 of FIG. 3b) that the elements 83 span. Next, the present invention computer apparatus 23 determines if there are fewer than a preassigned number of elements (for example three or so) within the bounding box 81. If there are, then the elements are designated as a "spanning set" and represented by an inner leaf node 55 branching from the current working tree node 35 of the tree 33.

Otherwise, two orthogonal dividing lines (Divlne 1 and Divlne 2 shown in FIG. 4b) are calculated for the bounding box 81, typically at the mid points of the sides of the box's rectangular shape as detailed at 69 in FIG. 3b. It is understood that other points are suitable in other implementations of the tree 33. To that end, one dividing line lies along the major axis of the bounding box 81 and longitudinally divides the rectangle shape in half. The second dividing line lies along the minor axis of the bounding box 81 and further divides the rectangle shape in half along an orthogonal direction. The longest dividing line, i.e. the dividing line along the major axis, is designated as the "splitting axis." It is understood that in a like manner the shortest dividing line may serve as the splitting axis.

As shown at 73 (FIG. 3b), the current set of elements 83 is then split into subsets according to the segments into which the bounding box 81 has been divided by the dividing lines. It is noted that the segments into which the bounding box 81 has been divided are rectangles or subbounding boxes themselves. Those elements 83 which straddle both dividing lines are placed in a "spanning set" and represented by an inner leaf node 55 branching from the current working tree node 35 of the tree 33. The remaining elements are placed in left, middle or right subtrees of the current working tree node 35 depending on whether the elements are completely to one side of the splitting axis, whether they straddle the splitting axis or whether they are on the opposite side of the splitting axis, respectively. These subtrees (i.e. subsets of elements) are recorded in respective nodes of the tree 33, in particular each subtree has a root node defined by a respective tree node 35 branching from the current working tree node 35.

Next, each subtree is recognized as containing a respective subset of model elements 83 according to the segments (i.e., sub-bounding boxes) into which the bounding box 81 was divided. To that end, for each subtree there is a corresponding sub-bounding box about the subset of model elements which define the subtree. Each sub-bounding box is handled as a bounding box in its own right and is recursively processed using the foregoing bounding box and dividing lines techniques i.e., by a call to the tree construction procedure 67 outlined in FIG. 3b.

Figure 4B:
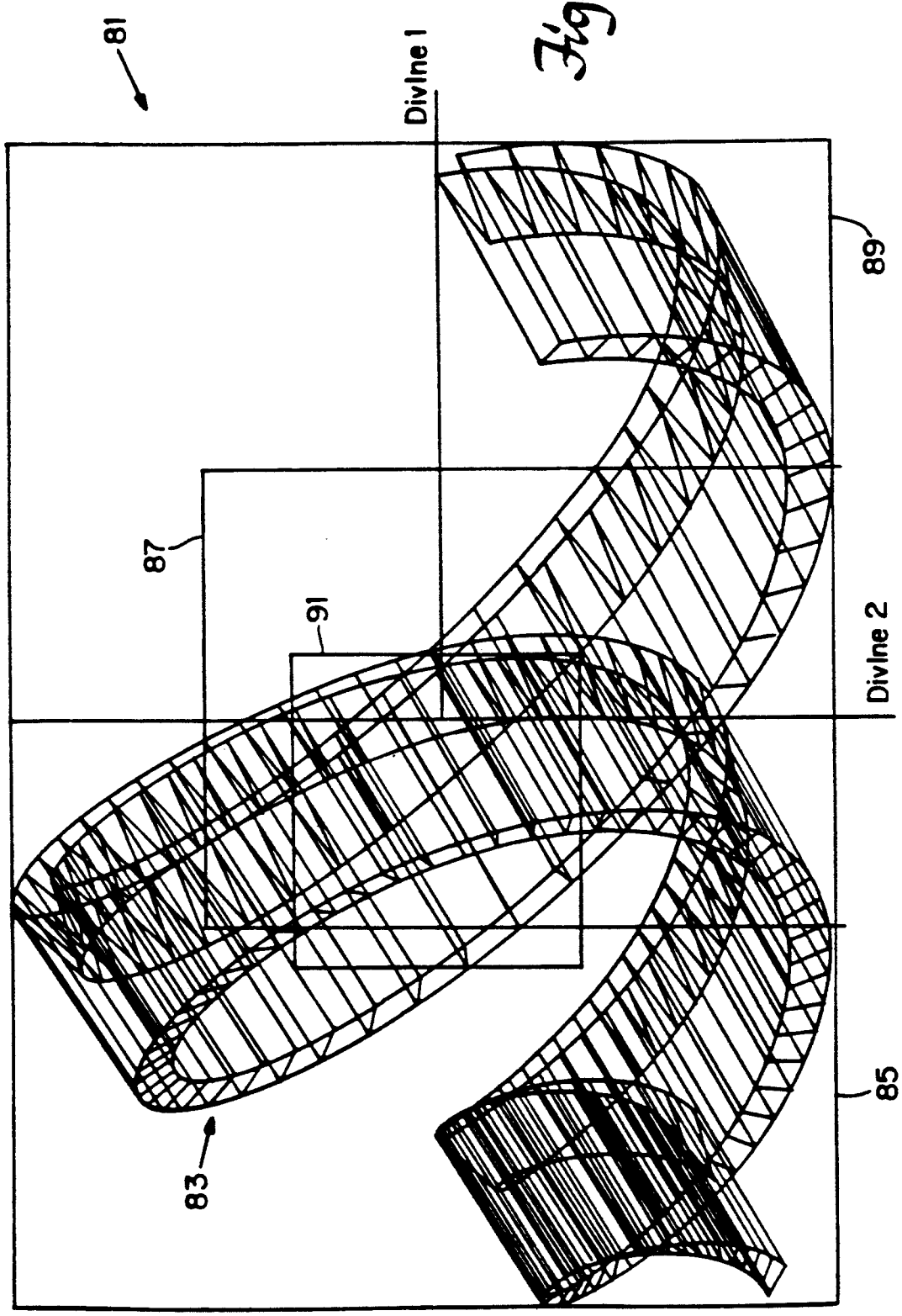
Figure 4E:
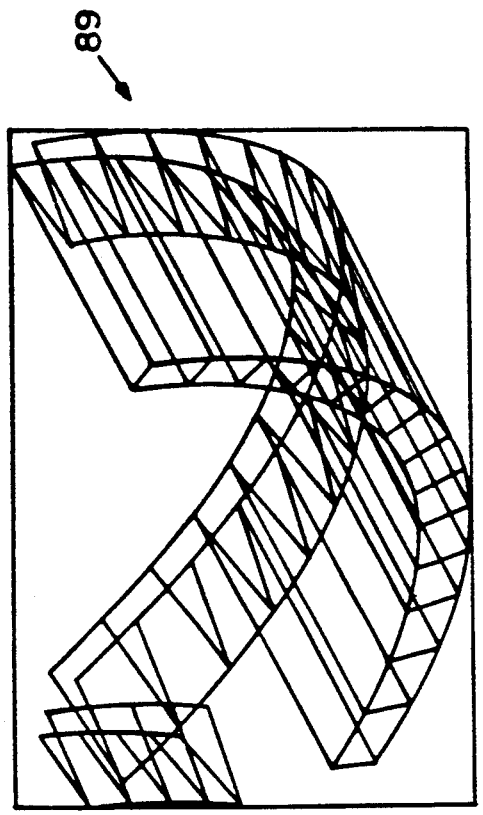
Figure 4F:
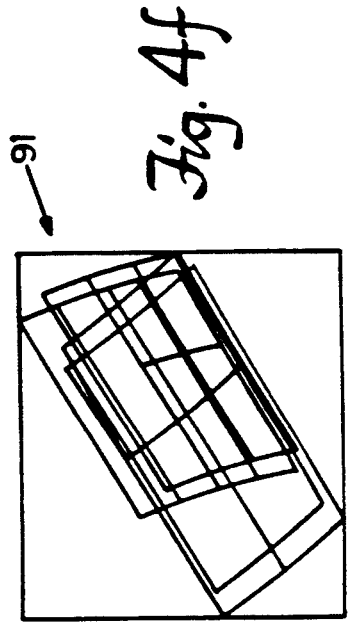
Figure 4C:
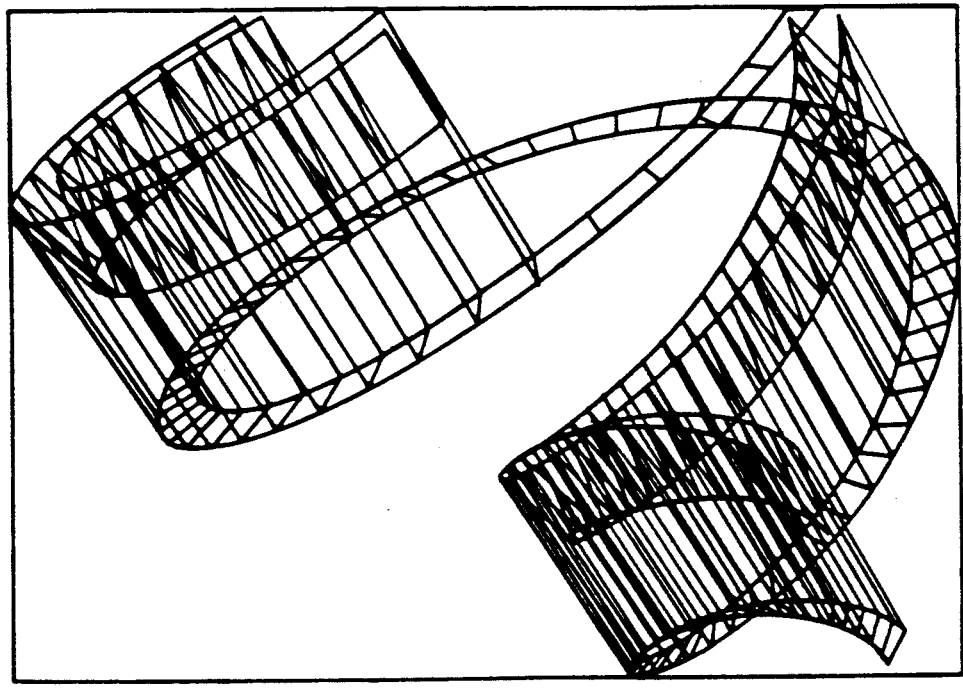

In the example of FIGS. 4a-4g, Divlne 2 (FIG. 4b) serves as the splitting axis. Formed to the left of and including the splitting axis (Divlne 2) is the subset 85 of model elements within its own bounding box as shown in FIGS. 4b and 4c. The subset 85 of elements 83 is placed in a left subtree of the current working tree and recorded in a set of tree nodes (root node only shown) branching from the current working tree node 35 as illustrated at L in FIG. 4g.

Bridging the splitting axis is element subset 87 shown in FIG. 4b. The subset 87 of elements 83 is placed in a middle subtree and recorded in a set of tree nodes with a root node branching from the current working tree node 35 as illustrated at M in FIG. 4g. Note in FIG. 4d, the middle subset 87 is shown in its own bounding box (i.e., sub-bounding box of bounding box 81) as defined by the extent along x-y axes of the elements that bridge Divlne 2. Subset 87 excludes the elements 83 of spanning set 91 described below.

Formed to the right of and including the splitting axis is subset 89 (FIG. 4a) in its own bounding box (i.e., sub-bounding box of bounding box 81) as independently shown in FIG. 4e. The subset 89 of elements 83 is placed in a right subtree of the current working tree and recorded in a set of tree nodes with a root node branching from the current working tree node 35 illustrated at R in FIG. 4g.

Figure 4D:
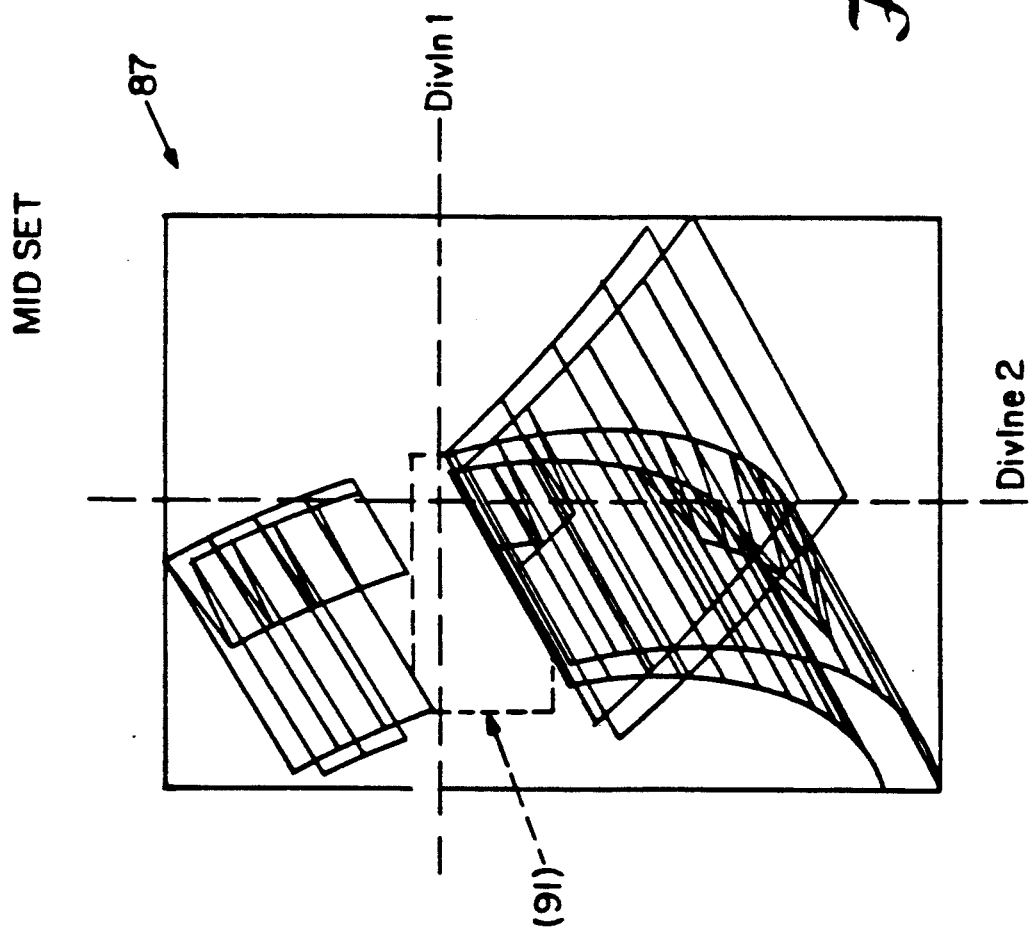
Figure 4G:
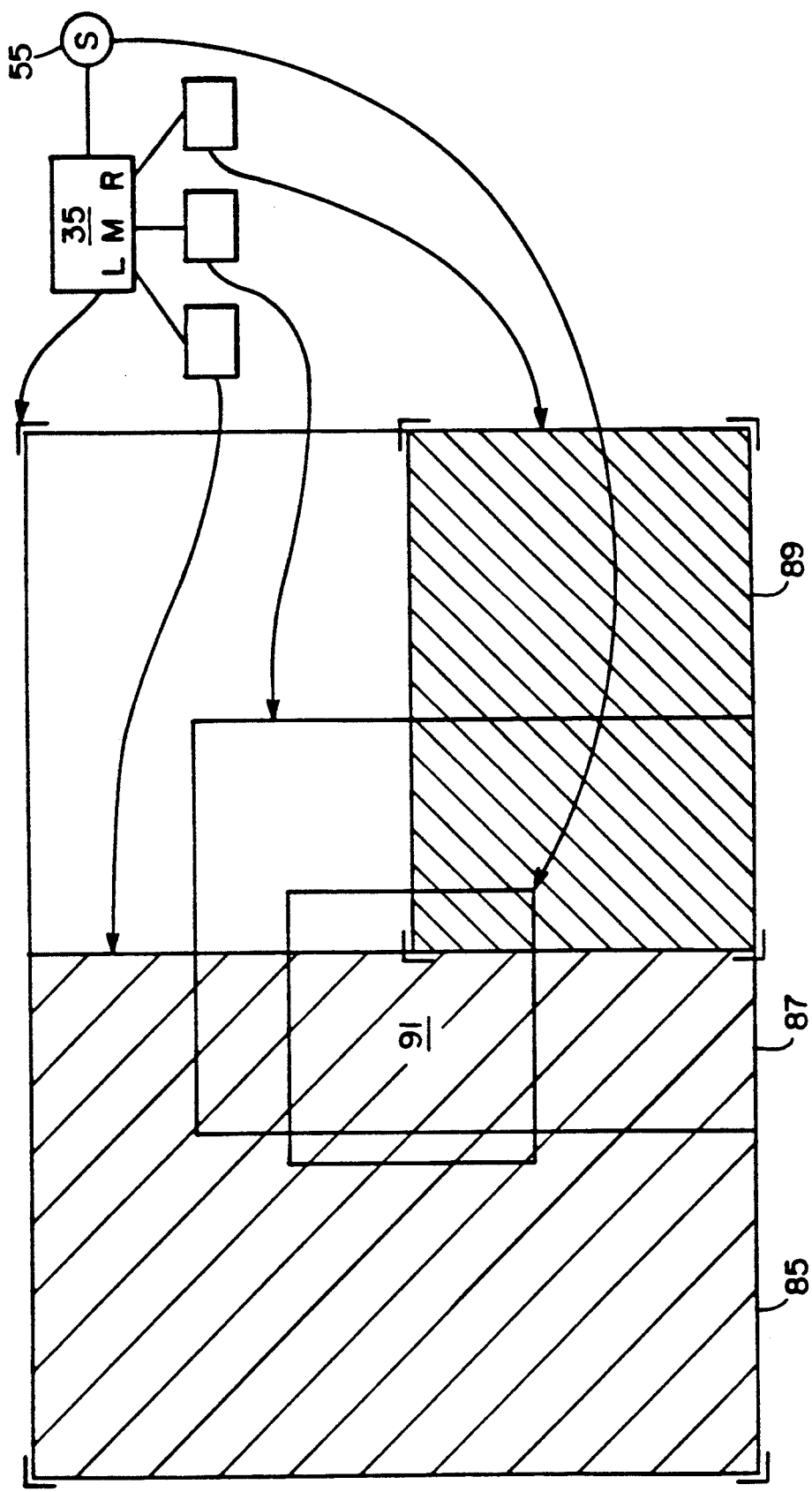

The subset 91 of elements 83 which straddles both Divlne 1 and Divlne 2 in FIG. 4b forms a spanning set. This set is represented by and recorded in inner leaf node 55 branching from the current working tree node 35 as illustrated in FIG. 4g. FIG. 4f shows this subset 91 in its own bounding box as defined by the extent along x-y axes of elements that straddle both Divlne 1 and Divlne 2. These are the elements excluded from middle subset 87 (FIG. 4d).

According to the foregoing, leaf nodes 37, 55 correspond to spanning sets and are designated with an "S" in FIG. 2a and tree nodes 35 are indicated with a "T" in FIG. 2a. Each tree node 35 and leaf node 37, 55 of the tree 33 holds respective information in memory records illustrated in FIGS. 2b and 2c. The record for a tree node 35 as illustrated in FIG. 2b has a heading 41 which indicates that the record corresponds to a tree node 35 as opposed to a leaf node 37, 55. A coordinates field 43 of the record indicates x, y coordinates of the bounding box defined for the tree node 35 of the record. Field 45 indicates the splitting axis established for the bounding box. The following fields 47 provide four pointers into memory block 31. The first pointer points to the memory block 31 addresses of model elements of the spanning set, i.e. set of elements which straddle both dividing lines of the bounding box. A second pointer indicates the memory block 31 addresses of model elements of the left subtree which branches from the tree node 35 associated with this record. A third pointer points to memory block 31 addresses containing the model elements of a middle subtree that branches from the node 35 of the record. A fourth pointer points to memory block 31 addresses for the model elements of a right subtree that branches from the node 35 of the record.

Referring to FIG. 2c, a record associated with a leaf node 37, 55 of the tree 33 and hence a spanning set has three fields as follows. A header field 49 provides an indication that the record holds information pertaining to a leaf node 37, 55 (spanning set). A second field 51 provides the geometric coordinates of the bounding box. A third field 53 provides a pointer to the list of model elements in the spanning set.

Thus as the tree 33 is created, records for spanning sets (leaf nodes 37, 55) and tree nodes 35 are generated. If no model elements fall within any of the formed subsets (i.e., subtrees) of a tree node 35 a null pointer is inserted in the tree 33 instead.

The foregoing tree arrangement and formation is well suited to the kind of geometry that arises in finite element modeling. If any particular large element of a subject model is present, it will likely be represented in a spanning set (inner leaf node 55) near the root 39 of the tree 33, where it will not interfere further with the classification of the remaining elements of the model. On the other hand, there are usually not very many spanning sets (inner leaf nodes 55) near the tree root 39, so time involved in traversing the tree 33 during the query phase is minimized as described next.

Query Phase

Figure 3C:
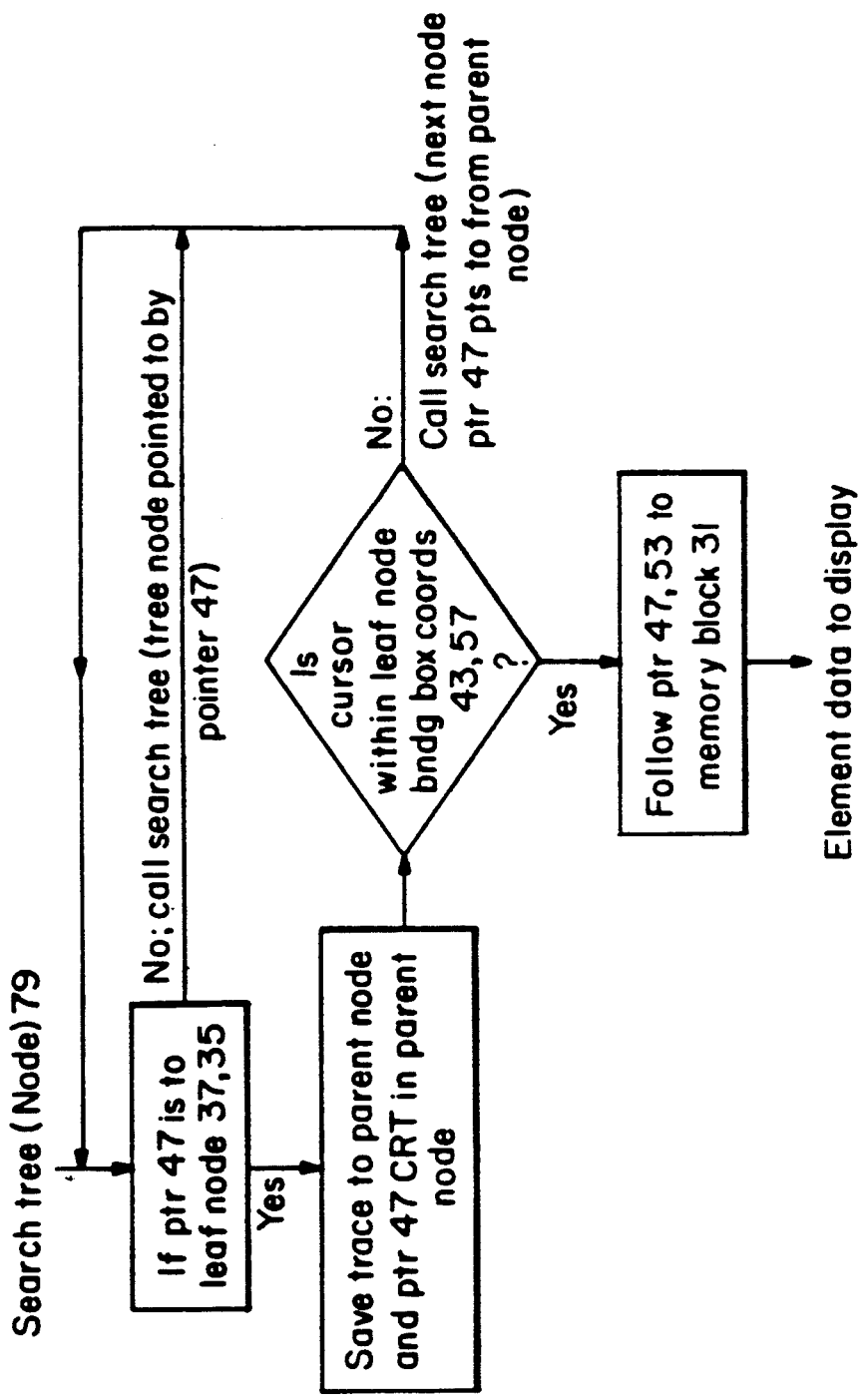

In the query phase 75 (FIG. 3a), the tree 33 is used repeatedly for interactive querying or hidden line drawing and other applications. In the preferred embodiment, a user selects a region of a desired model displayed in the screen view on the display unit 19 by positioning the cursor 29 on a displayed element in the sought region. In response, the present invention displays the region near the screen cursor 29 in a main part 27 of the screen view and outputs to the screen some numerical data (such as a stress value or a 3D coordinate) about the element positioned closest to the cursor 29. To accomplish this, the present invention computer apparatus 23 recursively tests the subject region (preferably defined by a predetermined size rectangle or other closed geometric shape surrounding the cursor 29) against the tree 33. In particular, apparatus 23 follows pointers 47 (FIG. 2b) and traverses tree 33 from root node 39 to subsequent levels of tree nodes 35, and ending with inner leaf nodes 55 or leaf nodes 37 on the lower terminal level. Such traversing is preferably by a recursive routine 79 that calls itself for each tree node 35 pointed to by pointers 47 of a node and otherwise processes nodes as follows and outlined in FIG. 3c. It is understood that other common methods (recursive or not) for traversing the tree 33 using pointers and bounding box information at each node of the tree are suitable.

Effectively at each node, apparatus 23 determines whether any subtrees (tree nodes 35) or spanning sets (leaf nodes 37, 55) of the node have bounding boxes, as indicated in corresponding record fields 43, 51 respectively, which overlap the subject query region. If the coordinates of a node's bounding box at 43, 51 of FIGS. 2b and 2c lie substantially in the subject region, apparatus 23 follows the spanning set pointer 47, 53 corresponding to the node and obtains element data from memory block 31. Apparatus 23 tests element location indicated in that data against the current cursor position. Where the two locations match, apparatus 23 further outputs the element data to display unit 19 for display on screen view part 27.

The foregoing search is far faster than linearly searching an entire list of elements as in the prior art. A typical example might be fewer than twenty elements tested per query out of a model of ten thousand elements in the present invention. Hence, the number of tested elements is typically proportional to the log of the number of elements in the model. This speed improvement over the prior art makes interactive query in response to cursor motion practical on low cost workstations, leading to a great time savings in the normally tedious phase of model verification and interpretation.

For hidden line drawing, screen position of line segments of a desired model may be quickly checked for intersection with coordinate positions within the bounding boxes of nodes in the tree 33. Determination of such an intersection is accomplished by traversing the tree 33 and testing nodes 35, 37 as described above. That is, positional information of the elements pointed to by particular nodes of the tree 33 are tested against the cursor position in the subject screen view of the model, to determine if there exist overlapping points or line segments in the model. Again, a logarithmic time per line rather than a linear query time is achieved by the present invention.

Equivalents

While the invention has been particularly shown and described with reference to a preferred embodiment thereof, it will be understood by those skilled in the art that various changes in form and details many be made therein without departing from the spirit and scope of the invention as defined by the appended claims.

I claim:

1. In a computer system having (i) a source of models of objects, each model formed of a plurality of elements, (ii) a memory area holding data defining each element, (iii) a display unit for displaying screen views of a model, and (iv) a digital processor coupled to the source of models, memory area and display unit, the digital processor enabling user interaction with the screen view of a desired one of the models, computer apparatus for accessing from the memory area data of elements of a desired mode, computer apparatus comprising:

(a) a memory for holding a data tree, the data tree having:
a root node, and
a plurality of tree nodes and leaf nodes corresponding to subsets of elements of a desired model,
the root node and plurality of tree nodes and leaf nodes arranged in a hierarchy such that the root node is at a highest level, the tree nodes are at intermediate levels and leaf nodes are at a lowest level, each leaf node providing an indication of location in the memory area of data of corresponding elements, within each of the intermediate levels, nodes in a common level being arranged according to spatial relationship of corresponding subsets of elements of the model with respect to at least one axis of a geometric area covered by the elements of the corresponding subsets in a screen view of the model; and (b) the digital processor capable of traversing the data tree in response to user interaction with a desired element of a model display on the display unit, the digital processor traversing the tree according to geometric area in which the desired element is positioned in a screen view of the model, the digital processor locating a leaf node in the tree corresponding to the desired element, and from the leaf node the digital processor obtaining indication of location in the memory area of data of the desired element, such that the digital processor may access the data using the location in the memory area of data of the desired element.

2. Computer apparatus as claimed in claim 1 wherein the digital processor performs a recursive routine for traversing the tree.

3. Computer apparatus as claimed in claim 1 wherein the data tree is recursively constructed by the digital processor in a working memory in response to an initial user command to query a desired model.

4. Computer apparatus as claimed in claim 1 wherein the geometric area covered by elements corresponding to nodes in a common level is rectangular and has a longitudinal axis, such that the nodes in the common level are arranged with a first node corresponding to a subset of elements lying on one side of the longitudinal axis being positioned at one end of the common level, a second node corresponding to a subset of elements lying on an opposite side of the longitudinal axis being positioned at an opposite end of the common level, and a third node corresponding to a subset of elements bridging the longitudinal axis being positioned between the first and second nodes in the common level.

5. Computer apparatus as claimed in claim 4 wherein the rectangular geometric area further includes a minor axis transverse to the longitudinal axis; and the data tree further has a leaf node corresponding to a subset of elements straddling both the longitudinal and minor axes.

6. Computer apparatus for user interaction with finite element models comprising:
a digital processor;
a first memory coupled to the digital processor for holding a plurality of models of objects, each model formed of a multiplicity of elements;
a second memory coupled to the digital processor for holding data defining each element of the models;
a display unit coupled to the digital processor for displaying screen views of the desired model;
a working memory coupled to the digital processor for holding a tree data structure of a desired model, the tree data structure having a plurality of leaf nodes and tree nodes, the leaf nodes corresponding the plurality of elements of the model and the tree nodes corresponding to sets of element of the model, each tree node providing an indication of the leaf nodes of the corresponding elements, and each leaf node providing an indication of location in the second memory of data defining the corresponding the element; and the digital processor capable of traversing the tree data structure in response to user interaction with a desired element of the model during display of a screen view of the model on the display unit, the digital processor traversing the tree data structure from tree nodes to a leaf node corresponding to the desired element, such that location in the second memory of data defining the desired element is obtained in an amount of time that is proportional to (log n) where n is the number of elements in the desired model.

7. Computer apparatus as claimed in claim 6 wherein the digital processor performs a recursive routine for traversing the tree data structure.

8. Computer apparatus as claimed in claim 6 wherein the tree nodes and leaf nodes of the tree data structure are arranged in a hierarchy of levels according to spatial relationship of corresponding elements with respect to an axis of a geometric area covered by the elements in the model, nodes in a common level being arranged such that a first node corresponding to a set of elements lying on one side of the axis is positioned at one end of the common level, a second node corresponding to a set of elements lying on an opposite side of the axis is positioned at an opposite end of the common level, and a third node corresponding to a set of elements straddling the axis is positioned between the first and second nodes of the common level.

9. Computer apparatus as claimed in claim 8 wherein the geometric area is rectangular in shape and the axis is a longitudinal axis.

10. Computer apparatus as claimed in claim 8 wherein:
the geometric area further includes a transverse axis; and
the leaf nodes include nodes corresponding to elements of the model that bridge both axes.

11. In a computer system having (i) a source of models of objects, each model formed of a plurality of elements (ii) a first memory area holding data defining each element, (iii) a display unit for displaying screen views of a model and (iv) a digital processor enabling user interaction with the screen view of the model, a method for accessing from memory data of elements of a desired model comprising the steps of:
providing in a working memory a data tree having a root node and a plurality of tree nodes and leaf nodes, the leaf nodes corresponding to elements of a desired model and the tree nodes corresponding to sets of the elements, the root node and plurality of tree nodes and leaf nodes arranged in a hierarchy such that the root node is at a highest level, the tree nodes are at intermediate levels and leaf nodes are at a lowest level, each leaf node providing an indication of location in the first memory area of data of corresponding elements, within each of the intermediate levels, nodes in a common level being arranged according to spatial relationship of corresponding sets of elements of the model with respect to at least one axis of a geometric area covered by the elements in a screen view of the model;
in response to user interaction with a desired element of a model displayed in the screen view of the display unit, traversing the tree according to geometric area in which the desired element is positioned in the displayed screen view of the model, the step of traversing including locating a leaf node in the data tree corresponding to the desired element; and from the located leaf node, obtaining indication of location in the first memory area of data of the desired element, such that the digital processor may access the data using the location in the first memory area of data of the desired element.

12. A method as claimed in claim 11 wherein the step of providing a data tree includes recursively constructing the tree in the working memory area in response to an initial user command to query a desired model.

13. A method as claimed in claim 11 wherein the step of traversing the data tree and locating a leaf node corresponding to the desired element further includes recursively searching for the leaf node.

14. A method as claimed in claim 11 wherein the step of providing a data tree further includes:

defining a rectangular boundary of the geometric area covered by the elements such that there is a major axis and a transverse minor axis of the geometric area; and arranging tree nodes of a common level by
  (i) positioning at one end of the common level, a first tree node corresponding to a set of elements lying on one side of the major axis,
  (ii) positioning at an opposite end of the common level, a second tree node corresponding to sets of elements lying on an opposite side of the major axis; and
  (iii) positioning between the first and second tree nodes, a third node corresponding to element straddling the major axis.

15. A method as claimed in claim 14 wherein the step of providing a data tree further includes defining leaf nodes corresponding to elements of the model that straddle both the major and minor axes.

* * * * *